United States Patent
Deas et al.

(10) Patent No.: US 7,257,870 B2
(45) Date of Patent: Aug. 21, 2007

(54) FIXING FOR MOUNTING A CIRCUIT BOARD OR A COMPONENT TO A HOUSING OR A SUPPORTING MEMBER

(75) Inventors: Christian Dudley Deas, Nr. Newmarket (GB); Robert Mathias Reisel, Arlington Heights, IL (US)

(73) Assignee: Richco International Company Limited, Kent (GB)

( * ) Notice: Subject to any disclaimer, the term of this patent is extended or adjusted under 35 U.S.C. 154(b) by 0 days.

(21) Appl. No.: 10/884,387

(22) Filed: Jul. 1, 2004

(65) Prior Publication Data
US 2005/0047860 A1    Mar. 3, 2005

(30) Foreign Application Priority Data
Jul. 1, 2003   (GB)   ................... 0315454.9

(51) Int. Cl.
A44B 21/00   (2006.01)
(52) U.S. Cl. .......................... 24/453; 24/297
(58) Field of Classification Search ................ 248/638; 267/141, 292, 153; 24/289, 295–297, 458, 24/453; 411/508–510
See application file for complete search history.

(56) References Cited

U.S. PATENT DOCUMENTS

| | | | |
|---|---|---|---|
| 1,720,545 A * | 7/1929 | Dickey | ................... 267/30 |
| RE24,488 E * | 6/1958 | Demurjian | ............. 174/166 S |
| 4,430,776 A | 2/1984 | Shimizu et al. | |
| 4,495,380 A | 1/1985 | Ryan et al. | |
| 4,527,312 A | 7/1985 | Ruehl et al. | |
| 4,938,703 A | 7/1990 | Nakano | |
| 5,214,569 A | 5/1993 | Hsiang | |
| 5,301,396 A | 4/1994 | Benoit | |
| 5,685,682 A * | 11/1997 | Glime et al. | ................. 411/510 |
| 6,399,888 B1 | 6/2002 | Chen | |

FOREIGN PATENT DOCUMENTS

| | | |
|---|---|---|
| DE | 35 24 791 | 1/1987 |
| DE | 38 12 093 A | 1/1989 |
| GB | 1 517 823 A | 7/1978 |
| GB | 2 206 640 A | 1/1989 |
| JP | 03272308 A * | 12/1991 |

OTHER PUBLICATIONS

Search Report dated Nov. 15, 2005 in EP Application No. 04253981.7 (4 pages).
Search Report dated May 5, 2004 in United Kingdom Application No. GB 0315454.9 (3 pages).

* cited by examiner

Primary Examiner—James R. Brittain
(74) Attorney, Agent, or Firm—Flynn, Thiel, Boutell & Tanis, P.C.

(57) ABSTRACT

A fixing 26 for fixing a circuit board to a housing. The fixing comprising a first connector 10 having an axis, at one end of which is a portion adapted to be connected to a housing, supporting member, circuit board or component. At the other end of the first connector 10 there is a second portion 22 around which is moulded a damping means 12. The fixing further comprises a second connector 28 having an axis at the end of which is a portion adapted to be connected to a housing, supporting member, circuit board or component and at the other end of which is a second portion 22 around which the damping means 12 is moulded, The first is connector 10 is coupled to the second connector 26 by the damping means 12.

37 Claims, 6 Drawing Sheets

FIXING FOR MOUNTING A CIRCUIT BOARD OR A COMPONENT TO A HOUSING OR A SUPPORTING MEMBER

The present invention relates to a fixing for mounting a circuit board or a component to a housing or a supporting member. It also relates to a method of manufacturing such a fixing, and to a connector component for such a fixing.

Vibration dampers are used to fix circuit boards and other components to housings. Vibration dampers are particularly used to protect circuit boards or other components from damage when they are in environments that are subjected to vibration or shock, such as in a washing machine.

Known vibration dampers comprise a circular block or pad of silicone rubber or natural rubber having a screw thread passing through the centre and protruding from both sides of the pad. To attach a circuit board or other component to a housing, one protruding portion of the screw thread is passed through a hole in a circuit board or other component and secured by a nut. The other protruding portion of the screw thread is passed through a hole in a housing or supporting member and secured using another nut. Fixing circuit boards and other components in this way is slow and labour intensive. Furthermore, such a fixing is only suitable for mounting to a circular through hole and the dampers are large in size.

There is a demand for a fixing for mounting a circuit board or other component to a housing or supporting structure which provides a vibration damper and which is quick to install, simple to manufacture and may in some embodiments be used for fixing in situations where the circuit board or housing does not have a through hole.

The invention in its various aspects is defined in the independent claims below, to which reference should now be made. Advantageous features are set forth in the appendant claims.

The invention will now be described in more detail, by way of example, with reference to the drawings, in which.

Figure 1:
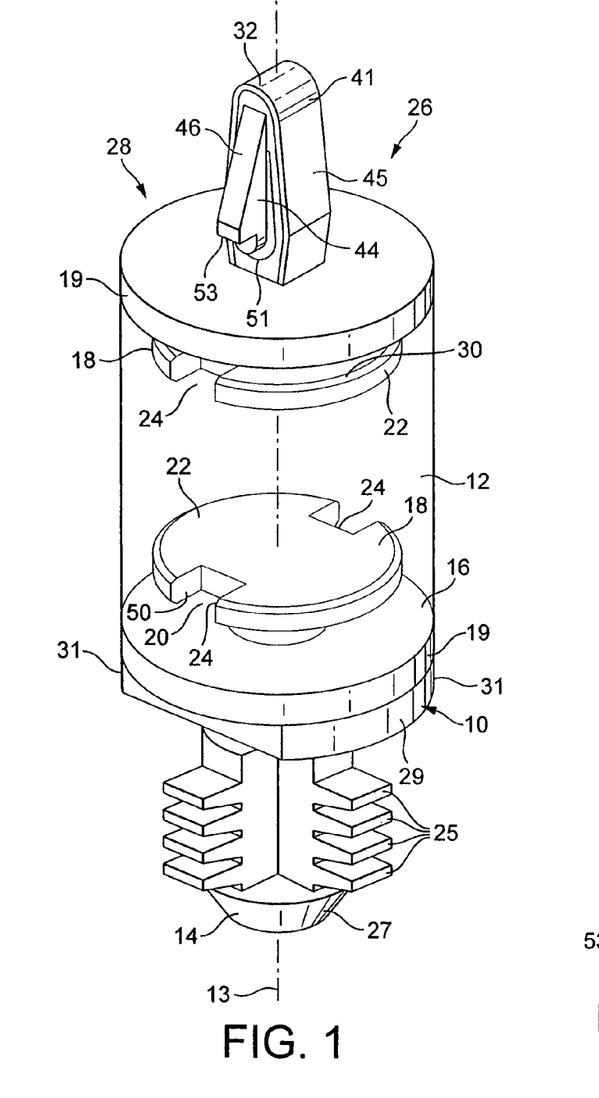
FIG. 1 shows a perspective view of a fixing in accordance with the present invention.

As shown in FIG. 1, a fixing 26 for mounting a circuit board or other component to a housing or a supporting member comprises connectors 10 and 28 coupled together by damping means 12.

The first connector 10 comprises at one end a first portion 14 for connecting the fixing 26 to a housing or a supporting member and at the opposite end a portion 16 moulded into the damping means 12, The second connector 28 has a first portion 32 for connecting the fixing to a circuit board and at its opposite end a portion 30 moulded into the damping means 12. The connector 10, the damping means 12 and the connector 28 extend along an axis 13.

In the example shown, the damping means 12 is made from an elastomer, for example, a thermoplastic elastomer compound such as a styrenic thermoplastic elastomer compound or a (styrene-ethylene butylene-styrene) block copolymer. EVOPRENE® may be used. Preferably, the first connector 10 and the second connector 26 are made from nylon.

The inner ends 16, 30 of each of the connectors 10, 28 is formed to provide a holding means 18 which is embedded in the material of the damping means 12 and prevents the connector 10, 28 being pulled axially out of the damping means 12 or being rotated relative to the damping means 12.

Each connector 10, 28 has a disc-shaped body 19 from which the connecting portions 14, 32 project outwardly along the axis 13 and the holding means 18 project inwardly along the axis 13.

The holding means 18 comprises a generally circularly cylindrical stem 50 of smaller diameter than the body 19 and extending along the axis 13 into the damping means 12. The stem 50 has a flange 22 of larger diameter than the stem 50 around its free end. The flange 22 has two diametrically opposed notches 24 in its periphery, Each notch 24 extends through the flange 22. The diameter of the flange 22 is less than the diameter of the damping means 12.

The flange 22 provides an overhang around which the elastomeric material can grip the holding means and thus prevent the connector 10, 28 being pulled out of the damping means 12.

The notches 24 provide recesses which can accommodate the elastomeric material to lock the holding means 18 to the elastomeric material and prevent the damping means 12 being rotated with respect to the holding means 18.

The disc-shaped body 19 abuts the end of the damping means 12 and together with the flange 22 prevents axial movement of the connector 28 into the damping means 12.

Each connector 10, 28 comprises means for locating the fixing 26 relative to the circuit board or other structure in a plane transverse to its longitudinal axis 13 and means for retaining the fixing 26 and the circuit board or other structure together. Generally the locating means comprise a projection which can be located in a hole in the circuit board. The retaining means comprise latching means or frictional engaging means. Where the retaining means are latching means, they may engage the circuit board or other structure around the hole in which the locating means are placed, or they may engage another part of the circuit board or other structure, for example, the edge of the circuit board. In the case where the retaining means are frictional engaging means they may be arranged so as to engage the wall of the hole in which the locating means are placed.

Each connector 10, 28 has means for abutting the near side of the circuit board or other structure to locate the fixing 26 axially relative to the circuit board or other structure.

Figure 4:
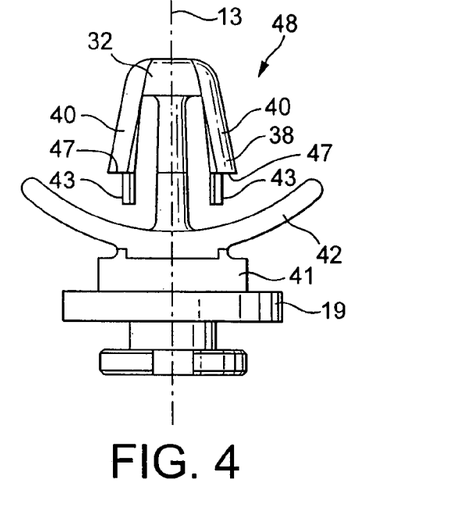
FIGS. 4 and 5 show side elevations of other embodiments of connector components in accordance with the present invention.
Figure 5:
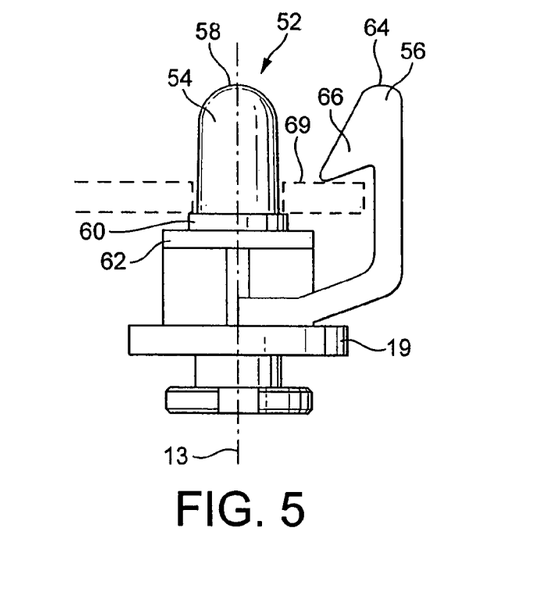
Figure 6:
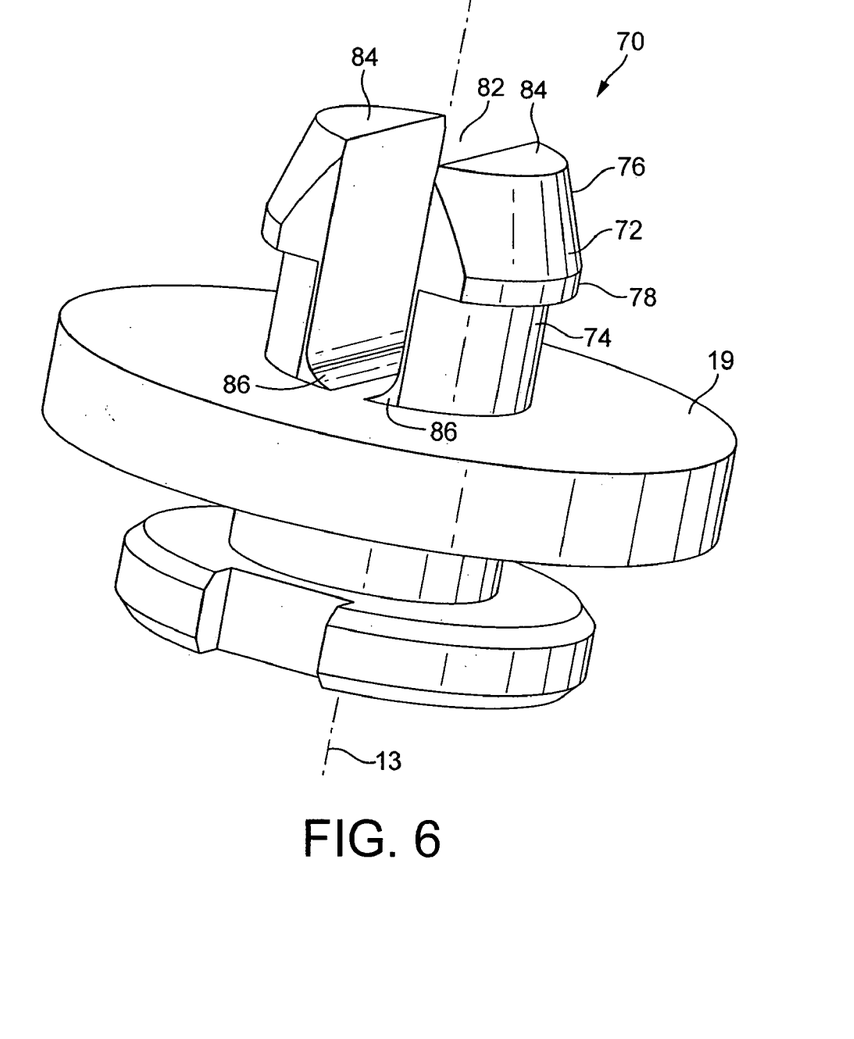
FIG. 6 shows a perspective view of another embodiment of a connector component in accordance with the present invention.

The connectors can take various forms. Two examples of connector are shown in the embodiment of FIG. 1. Other forms are shown in FIGS. 4, 5 and 6. Referring to the embodiment of FIG. 1, the first end portion 14 of the connector 10 provides both the locating and the retaining means and is adapted to enable the connector 10 to be connected to a blind hole in a housing or a supporting member. The first end portion 14 which is adapted to connect to a housing or a supporting member, viewed along the axis 13, has a cruciform cross-section. Fins 25 extend from each of the arms of the cruciform parallel to the axis of 25 associated arm. In the example shown in FIG. 1, four fins 25 are shown extending from each of the arms. The first end portion 14 terminates with a dome-shape head 27. The first end portion 14 is made of pliable plastics material, for example, nylon. In use, when inserted into a blind hole, the fins 25 bend and engage with the walls of the blind hole to locate the fixing 26 relative to the housing or supporting member in a plane transverse to the axis 13 and provide the frictional engaging means for retaining the fixing 26 relative to the housing or supporting member. The outer surface of the body 19 of the connector 10 abuts the near side of the housing or supporting member to locate the fixing 26 axially relative to the housing or supporting member.

A planar grip portion 29 is located between the disc-shaped body 19 and the first end portion 14. The planar grip portion 29 extends beyond the disc-shaped body on two sides. The edges of the protruding surfaces 31 act as a grip for a user to make it easier to connect and disconnect the fixing 10 to a housing or a supporting member.

Figure 2:
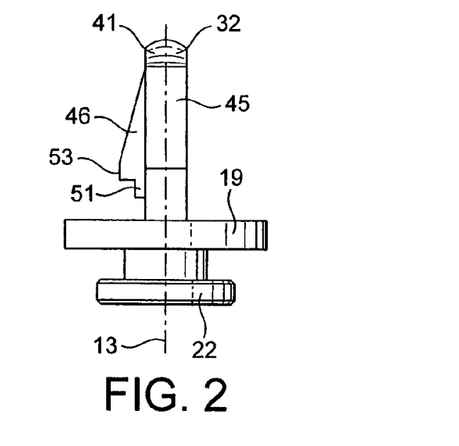
FIG. 2 shows a side elevation of a connector component of the fixing of FIG. 1.

The locating and retaining means of the connector 28 are of a different design to those of connector 10 and are adapted to push-fit to a through hole in a circuit board. As shown in FIG. 1 and in FIG. 2, the connector 28 has an end portion 41 extending along the axis 13 towards the free end 32, The end portion 41 is joined to the disc-shaped body 19 by limbs 45 which are bowed outwardly with a cut-out portion 44 between. As best shown in FIG. 2, a barb 46 extends sideways from the end portion 41. The barb 46 has a narrow extension 51 from its proximal end such that a lip 53 is formed at the end of the barb 46.

In use, when the end portion 41 is pushed into a through hole, the barb 46 is forced into the cut-out is portion 44 so that the head can pass through the through hole. The limbs 45 at their widest portion are squeezed together but there is still sufficient space between the limbs 45 to accommodate the barb 46. Once the barb 46 has passed through the hole it spring& outwardly due to its resilience. The barb 46 serves as retaining means to hold the circuit board on the locating means formed by the limbs 45 of the connector 28. The connector 28 cannot be separated from the circuit board unless the barb 46 is squeezed into the cut-out portion 44. The outer surface of the body 19 abuts the near side of the circuit board to locate the connector 28 axially relative to the circuit board.

The fixing 26 of FIG. 1, when fitted, has the outer ends of the connectors 10 and 28 fitted to a housing or a supporting member and to a circuit board respectively and the inner ends of the connectors 10 and 28 coupled together by the damping means 12 which allows damped relative movement of the two connectors 10 and 28 to absorb shocks or vibration.

To connect a circuit board to a housing, using a fixing as described above, the free end of the connector 10 is first pushed into the blind hole in the housing. A through hole in the circuit board is then pushed onto the free end of the connector 28 at the other end of the fixing 26.

Figure 3:
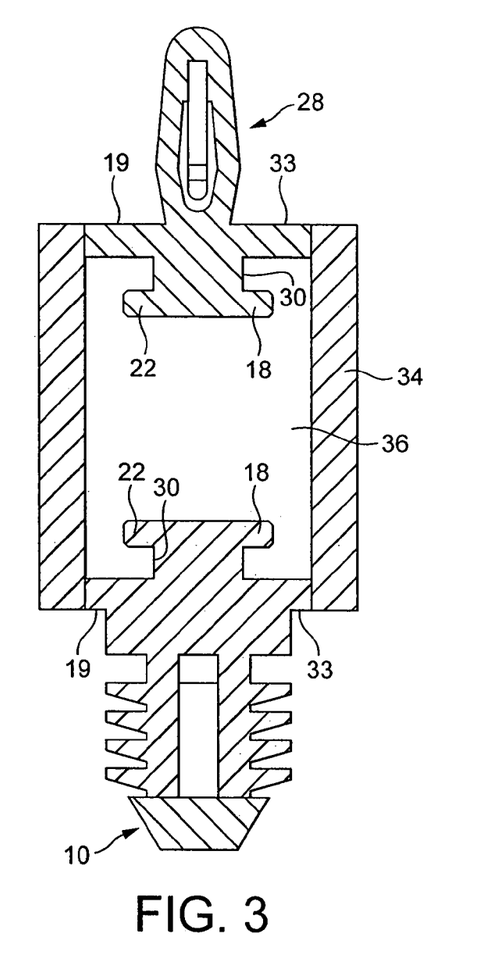
FIG. 3 shows a section through the fixing of FIG. 1 being manufactured by a method in accordance with the present invention.

A method of manufacturing a fixing 26 for fixing a circuit board to a housing, a supporting member or a component is illustrated in FIG. 3. Two connectors 10, 28 are placed in the open ends 33 of a cylindrical mould 34. The disc-shaped bodies 19 of the connectors 10, 28 form the ends of the mould 34. The inner end portions of the connectors 10, 28 pass into the mould 34. These are the parts that form the holding means 18. The inner ends 30 of the connectors 10, 28 are spaced from one another. Mouldable material 36 is placed into the mould 34 and allowed to set around the parts of the connectors 10, 28 that are disposed in the mould 34. The moulded material 36 joins the connectors 10, 28 together to form the fixing 26. The moulded material 36 enters between the flange 22 and the body 19 to lock the connector 10, 28 axially to the damping means 12. It enters the notches 24 to prevent rotation of the connectors 10, 28 relative to the damping means 12. Fixings 26 of different lengths can be manufactured by using different lengths of mould 34. Once the mouldable material 36 has set, the fixing 26 is separated from the mould 34.

FIGS. 4, 5 and 6 show alternative embodiments of connector 48, 52 and 70 which may be used in place of the connector 10 or 28 and in which the locating and retaining means are of different design to those of connectors 10 and 28.

The connector 48 of FIG. 4 which is adapted to push-fit to a through hole in a housing, a supporting member, a circuit board or a component, has an arrow-shape head 38 at the free end 32 of the connector 48 for passing through the through hole. The arrow-shape head 38 has two arms 40 protruding at an angle away from the axis 13. The arms 40 have narrow extensions 43 extending from their proximal ends such that a lip 47 is formed at the free end of each arm 40. A resilient arcuate portion 42, located between intermediate portion 41 and the arrow-shape head 38, extends transversely to the axis 13 with its concave side facing towards the free end 32 of the head 38. The intermediate portion 41 is located between the resilient arcuate portion 42 and the disc-shaped body 19.

In use, the arrow-shape head 38 is passed through the through hole and the arms 40 are pushed together by the walls of the through hole. Once the arms 40 have passed through the through hole, they spring outwardly due to their resilience and the lips 47 engage with the surface of the housing, supporting member, circuit board or component. The extensions 43 serve to locate the connector 48 relative to the circuit board or other structure in a plane transverse to the axis of the connector 48 and the lips 47 serve to retain the circuit board or other structure and connector 48 together. The other surface of the housing, supporting member, circuit board or component engages with the ends of the resilient arcuate portion 42 and the connector 10 is connected to the housing, supporting member, circuit board or component. The arcuate portion 42 flexes to hold the circuit board or other structure firmly in position. Thus the arcuate portion 42 abuts the near side of the circuit board or other structure to retain the connector 48 axially relative to the circuit board or other structure.

The connector 52 of FIG. 5 comprises a head portion 54 adapted to be pushed through a through hole near the edge of a circuit board or a component to locate the connector 52 relative to the circuit board or component in a plane transverse to the axis of the connector 52 and a clip portion 56 of the connector is adapted to latch on to the side of the circuit board or component to serve to retain it in place on the connector 52.

The head portion 54 is circularly cylindrical with a domed free end 58. It extends to a wider shoulder portion 60 which extends into an intermediate portion 62. The intermediate portion 62 has a disc-shaped body 19 at the opposing end to the shoulder portion 60. The clip portion 56 extends from the disc-shaped body 19 end of the intermediate portion 62, outwardly and at an angle to the disc-shaped body 19 before bending round and extending parallel to and spaced from the head portion 54, to a free end 64. A lug 66 protrudes from the free end 64 of the clip portion 56 inwardly towards the head portion 54. The lug 66 has a barbed shape. The clip portion 56 is resilient.

In use, the connector 52 is located in a transverse plane by inserting the head portion 54 through a through hole near the edge of the circuit board or component shown in broken line at 69. The edge 69 pushes the free end 64 of the resilient clip portion 56 outwardly. Once the circuit board or component is pushed passed the lug 66 of the clip portion 56, the clip portion 56 springs back towards the head portion 54 to its original position, due to the resilience of the clip portion 56. The lug 66 engages with the surface of the circuit board or component and serves as a retaining means to hold the connector 52 on the locating means formed by the head portion 54.

FIG. 6 shows another alternative embodiment of a connector 70 which may be used in place of the connector 10 or 28. The connector 70 is adapted to be a push-fit into a through hole in a housing, a supporting member, a circuit board or a component.

The connector 70 comprises a flexible protruding portion 72 which extends from the disc-shaped body 19 along the axis 13. The protruding portion 72 comprises a circularly cylindrical trunk 74 having a cone shape free end 76 for pushing into a through hole. The base 78 of the cone shape free end 76 overhangs the trunk 74. The protruding portion 72 has a diametrical slot 82 extending along the axis 13 which splits the protruding portion 72 into two halves 84. The two halves 84 can flex inwardly towards each other. A reinforcing portion 86 slopes outwardly from the end of each half 84 of the protruding portion 72 into the diametrical slot 82. The base 78 of the cone shape free end 76 serves as a retaining means to hold the housing, supporting member, circuit board or component on the locating means formed by the circularly cylindrical trunk 74.

In use, the cone shape free end 76 is pushed into a through hole. The through hole has a diameter less than the diameter of the overhanging base 78 of the cone shape free end 76. A camming action between the surface of the cone shape free end 76 and the edge of the through hole causes the two halves 84 of the protruding portion 72 to flex towards each other. The cone shape free end 76 passes completely through the through hole and the two halves 84 of the protruding portion 72 then flex outwardly, The base 78 of the cone shape free end 76 abuts the far side of the housing, supporting member, circuit board or component and the outer surface of the disc-shaped body 19 abuts the near side of the housing, supporting member, circuit board or component so that the connector 70 is held axially relative to the housing, supporting member, circuit board or component.

Figure 7:
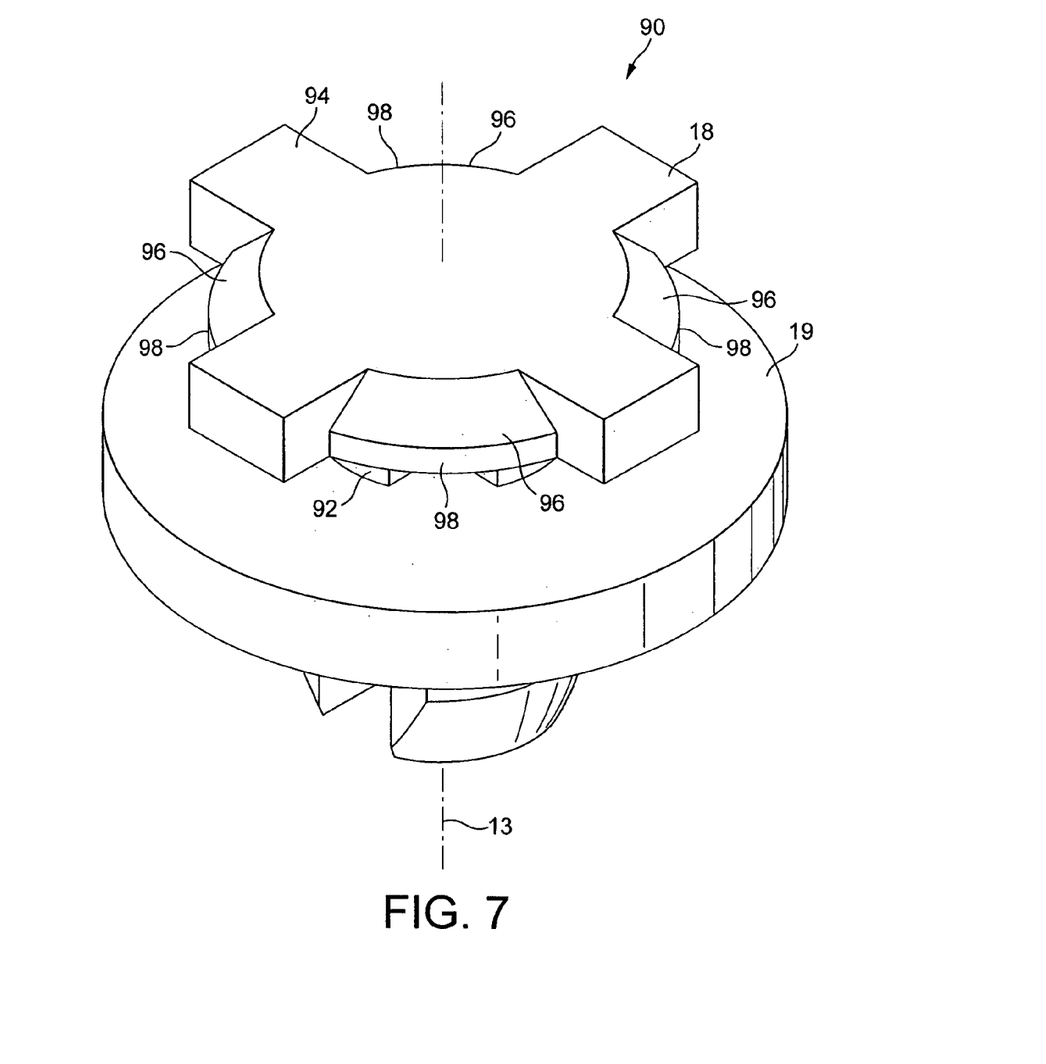
FIGS. 7 and 8 show perspective views of another embodiment of a connector component in accordance with the present invention.
Figure 8:
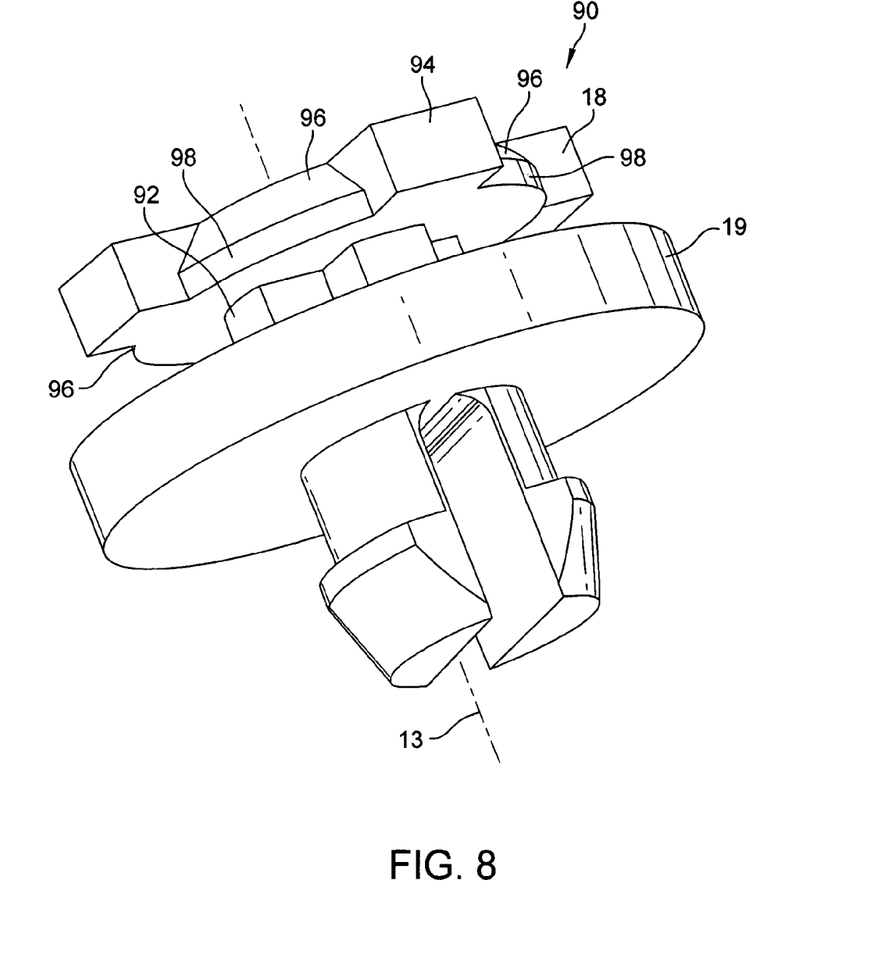

FIGS. 7 and 8 show a yet further embodiment of a connector 90 which may be used in place of the connector 10 or 28. The connector 90 has an alternative holding means 18.

As shown best in FIG. 8, the holding means 18 comprises a cruciform stem 92 projecting from the disc-shaped body 19 along the axis 13. The overall transverse dimension of the cruciform stem 92 is smaller than the overall transverse dimension of the body 19. The cruciform stem 92 has a flange 94 of larger overall transverse dimension than the overall transverse dimension of the cruciform stem 92 at its free end. The flange 94 has four notches 96 (see FIG. 7) equally spaced around its periphery. The inner edge 98 of each notch 96 is curved and has the shape of part of a circle centred on the axis 13. The inner edge 98 of each notch 96 extends parallel to the axis 13 and then slopes towards the axis 13 as the flange 94 extends along the axis 13 away from the cruciform stem 92.

The flange 94 provides an overhang around which the elastomeric material can grip the holding means and thus prevent the connector 90 being pulled out of the damping means 12.

The cruciform stem 92 and the notches 96 provide recesses which can accommodate the elastomeric material to lock the holding means 18 to the elastomeric material and prevent the damping means being rotated with respect to the holding means 18.

Although FIGS. 7 and 8 show the holding means 18 with the portion for connecting to a housing, a supporting member, a circuit board or a component of FIG. 6, any such portion for connecting may be used such as those illustrated in FIGS. 1 to 5.

Other designs of connectors 10, 28, 48, 52 and 70 may be provided suitable designs have locating means for locating the fixing 26 relative to the circuit board or other structure in a plane transverse to its longitudinal axis 13 and means for retaining the fixing 26 and the circuit board or other structure together.

The same design of connectors 10, 28, 48, 52, 70 may be provided on both ends of the fixing 26.

One, two, or more notches 24 may be provided in the flange 22.

The holding means 18 may be of another form that is shaped so as to create an overhanging portion around which the damping means 12 can grip to prevent the connectors 10, 28, 48, 52, 70 being pulled out of the damping means 12.

The overhanging portion may be formed by a portion of a lesser dimension transverse to the axis 13 followed by a portion of greater dimension transverse to the axis 13 nearer the end of the portion 16 moulded into the damping means 12.

The portion of greater transverse dimension may be formed by a transversely projecting flange around the portion 16 moulded into the damping means 12.

The damping means 12 can be made from materials other than those mentioned above, for example, other types of elastomeric materials such as silicone rubber or natural rubber may be used.

The connectors 10 and 28 may be made from materials other than nylon, for example, other polymeric materials may be used.

The connectors 10, 28, 48, 52, 70 described above may be used to connect a damping means 12 to a housing or a circuit board quickly and with few operations. Furthermore, the fixings 26 described above can be quickly and simply manufactured with various types of connectors 10, 28, 48, 52, 70 or to different lengths to suit different applications.

Embodiments of the present invention have been described with particular reference to the examples illustrated. However, it will be appreciated that variations and modifications may be made to the examples described within the scope of the present invention.

The invention claimed is:

1. A connector arrangement for mechanically connecting a housing, a supporting member, a circuit board or a component to a moulded damping element, a first connector having an axis at one end of which is a first portion adapted for connecting the first connector by push-fitting to a housing, a supporting member, a circuit board or a component, and at the other end of which is a second portion around which a damping element is moulded, the second portion including a holding element for preventing the first connector from being pulled axially out of the damping element and for preventing rotation of the first connector about the axis relative to the damping element, and wherein the damping element has a first end molded around the second portion of the first connector and a second end connected to a second connector, the second connector having an axis at one end of which is a first portion adapted for connection to a housing, a supporting member, a circuit board or a component by push fitting and a second portion around which the damping element is molded, the first and second connectors being coupled to one another by the damping element, the second portion of the second connector including a holding element for preventing the second connector from being pulled axially out of the damping element and for preventing rotation of the second connector about its axis relative to the damping element, wherein each said holding element is shaped so as to create an overhanging portion around which the respective damping element grips to prevent the respective connector from being pulled out of the damping element, wherein the overhanging portion of at least one of the holding elements has a non-circular cylindrical cross-section to prevent rotation, and wherein at least a portion of one of the holding elements has a generally cruciform cross-section oriented transverse to the axis.

2. A connector arrangement according to claim 1, including at least one collar extending perpendicular from the axis and spaced from at least one of the holding elements towards the first portion.

3. A connector arrangement according to claim 2, wherein the at least one collar is disc shape and is substantially centered on the axis.

4. A connector arrangement according to claim 1, wherein at least one of the first portions comprises means for locating the connector relative to the housing, the supporting member, the circuit board or the component in a plane transverse to the axis.

5. A connector arrangement according to claim 4, wherein the means for locating the connector comprises a projection which projects along the axis for placement in a hole in the housing, the supporting member, the circuit board or the component.

6. A connector arrangement according to claim 1, wherein at least one of the first portions comprises means for retaining the first connector to one of the housing, the supporting member, the circuit board or the component.

7. A connector arrangement according to claim 6, wherein the at least one of the first portions comprises a latch for latching on to part of the housing, the supporting member, the circuit board or the component.

8. A connector arrangement according to claim 6, wherein the at least one means for retaining the connector comprises frictional engaging means arranged so as to engage a wall of a hole.

9. A connector arrangement according to claim 6, wherein the means for retaining comprises one of: a latch which is connectable to part of a housing, a supporting member, a circuit board or a component; and a connector member configured to frictionally engage within a hole defined in a housing, a supporting member, a circuit board or a component.

10. A connector arrangement according to claim 1, wherein at least one of the first connector and the second connector is made from nylon.

11. A connector arrangement according to claim 1, wherein the damping element is made from an elastomer.

12. A connector arrangement according to claim 11, wherein the elastomer is a thermoplastic elastomer compound.

13. A connector arrangement according to claim 12, wherein the thermoplastic elastomer compound is a styrenic thermoplastic elastomer compound.

14. A connector arrangement according to claim 13, wherein the styrenic thermoplastic elastomer compound is a styrene-ethylene butylene-styrene block copolymer.

15. A connector arrangement according to claim 1, wherein each said overhanging portion is defined by a first part having a dimension defined transversely relative to the axis and a second part having a dimension defined transversely relative to the axis and greater than the dimension of the first part, the first part being disposed closer to the first portion of the corresponding connector than the second part.

16. A connector arrangement according to claim 15, wherein the second parts define respective transversely-oriented flanges, and each of the flanges includes therein a notch that defines the non-circular cross-section for preventing rotation of the corresponding connector relative to the damping element.

17. A connector arrangement according to claim 1, wherein said first connector and said second connector are spaced apart.

18. A connector arrangement according to claim 1, wherein at least one of said first portions is adapted for connecting to an electrical component.

19. A connector arrangement according to claim 1, wherein said first connector and said second connector are spaced from one another axially.

20. A connector arrangement according to claim 1, wherein at least one of the first connector and the second connector are made from polymeric material.

21. A connector arrangement according to claim 1, in which at least one of the overhanging portions is formed by a portion of a lesser dimension transverse to the axis followed by a portion of greater dimension transverse to the axis nearer the end of the second portion.

22. A connector arrangement according to claim 21, wherein at least one of the portions of greater transverse dimension is formed by a transversely projecting flange around the second portion.

23. A connector arrangement according to claim 22, wherein at least one of the flanges has at least one notch in it to prevent rotation of the connector relative to the damping element.

24. A connector arrangement according to claim 1, wherein at least one of the second portions has a generally circular cross-section.

25. A connector for mechanically connecting a housing, a supporting member, a circuit board or a component to a moulded damping means, the connector having an axis at one end of which is a first portion adapted for connecting the connector by push-fitting to a housing, a supporting member, a circuit board or a component, and at the other end of which is a second portion around which a damping means can be molded, the second portion including holding means shaped so as to create an overhanging portion around which the damping means is gripped to prevent the connector from being pulled axially out of the damping means and at least a portion of the holding means having a non-circular cylindrical cross-section to prevent rotation of the connector about the axis relative to the damping means, wherein at least a portion of the holding means has a generally cruciform cross-section oriented transverse to the axis.

26. A connector according to claim 25, in which the overhanging portion is formed by a portion of a lesser dimension transverse to the axis followed by a portion of greater dimension transverse to the axis nearer the end of the second portion.

27. A connector according to claim 26, wherein the portion of greater transverse dimension is formed by a transversely projecting flange around the second portion.

28. A connector according to claim 27, wherein the flange has at least one notch to prevent rotation of the connector relative to the damping means.

29. A connector according to claim 25, wherein the second portion has a generally circular cross-section.

30. A connector arrangement comprising a first connector defining an axis and having one end defining a first portion configured for connecting by push-fitting to one of a housing, a supporting member, a circuit board and a component, and an opposite end defining a second portion around which a damping element is molded, said second portion including a holding element configured for preventing said first connector from being pulled axially out of said damping element and for preventing rotation of said first connector about the axis relative to said damping element, a second connector defining an axis and having one end defining a first portion configured for connecting by push-fitting to one of a housing, a supporting member, a circuit board and a component, and an opposite end defining a second portion around which said damping element is molded, said second portion including a holding element configured for preventing said second connector from being pulled axially out of said damping element and for preventing rotation of said second connector about said axis, said first connector being coupled to said second connector by said damping element, wherein each holding element is shaped so as to create an overhanging portion around which the damping element grips to prevent the respective connector from being pulled out of the damping element, and wherein at least a portion of one of said holding elements has a generally cruciform cross-section oriented transverse to the axis.

31. The connector arrangement of claim 30, wherein said second portions of said first and second connectors each include a generally disc-shaped collar joined to the respective said holding element, and said holding elements of said first and second connectors each include a stem having a first transverse dimension less than a transverse dimension of the respective said collar and a flange having a second transverse dimension greater than the first transverse dimension, each said stem having a first end joined to the respective said collar and a second end joined to the respective said flange, each said flange and the respective said stem together defining the overhanging portion around which said damping element is molded to prevent removal of said first and second connectors from said damping element.

32. The connector arrangement of claim 31, wherein each said flange defines therein a notch to prevent rotation of said first and second connectors relative to said damping element.

33. The connector arrangement of claim 30, wherein said damping element is constructed of an elastomer.

34. A connector arrangement according to claim 30, wherein said first connector and said second connector are spaced apart.

35. A connector arrangement according to claim 30, wherein at least one of said first portions is adapted for connecting to an electrical component.

36. A connector arrangement according to claim 30, wherein said first connector and said second connector are spaced from one another axially.

37. A connector arrangement according to claim 30, wherein at least one of said first connector and said second connector are made from polymeric material.

* * * * *